(12) United States Patent
Wilson et al.

(10) Patent No.: US 8,908,798 B2
(45) Date of Patent: Dec. 9, 2014

(54) HYBRID DIGITAL/ANALOG POWER AMPLIFIER

(71) Applicant: LSI Corporation, Milpitas, CA (US)

(72) Inventors: Ross S. Wilson, Menlo Park, CA (US); Said E. Abdelli, Minneapolis, MN (US); Peter Kiss, Basking Ridge, NJ (US); Kameran Azadet, Pasadena, CA (US); Donald R. Laturell, Oak Hill, FL (US); James F. MacDonald, Stillwater, MN (US)

(73) Assignee: LSI Corporation, San Jose, CA (US)

( * ) Notice: Subject to any disclaimer, the term of this patent is extended or adjusted under 35 U.S.C. 154(b) by 89 days.

(21) Appl. No.: 13/729,231

(22) Filed: Dec. 28, 2012

(65) Prior Publication Data
US 2014/0184323 A1 Jul. 3, 2014

(51) Int. Cl.
*H04L 27/00* (2006.01)
*H03F 3/38* (2006.01)
*H03F 3/189* (2006.01)
*H03F 3/217* (2006.01)

(52) U.S. Cl.
CPC ............ *H03F 3/38* (2013.01); *H03F 3/189* (2013.01); *H03F 3/217* (2013.01)
USPC .......................................... 375/297; 375/295

(58) Field of Classification Search
None
See application file for complete search history.

(56) References Cited

U.S. PATENT DOCUMENTS

| | | | |
|---|---|---|---|
| 5,063,359 A * | 11/1991 | Leonowich | 331/116 FE |
| 5,867,535 A * | 2/1999 | Phillips et al. | 375/295 |
| 6,809,669 B1 | 10/2004 | Robinson | |
| 7,911,406 B2 * | 3/2011 | Eckwielen et al. | 343/833 |
| 2003/0179831 A1 | 9/2003 | Gupta et al. | |
| 2004/0150458 A1 * | 8/2004 | Gupta et al. | 327/407 |
| 2005/0099327 A1 | 5/2005 | Robinson et al. | |
| 2006/0068697 A1 * | 3/2006 | Tanabe et al. | 455/1 |
| 2006/0291589 A1 | 12/2006 | Eliezer et al. | |
| 2008/0265996 A1 | 10/2008 | Kim et al. | |
| 2011/0267127 A1 | 11/2011 | Staszewski et al. | |
| 2012/0170624 A1 | 7/2012 | Rozenblit et al. | |
| 2012/0286863 A1 * | 11/2012 | Gandhi et al. | 330/149 |
| 2014/0043104 A1 * | 2/2014 | Chen | 331/46 |

OTHER PUBLICATIONS

M. Berroth et al., "A 1.6 GHz switch mode power amplifier with continuous-time bandpass delta-sigma modulator," IEEE Int. Midwest Symp. Circ. Syst. MWCSAS, pp. 1051-1054, Aug. 2009.

* cited by examiner

*Primary Examiner* — Leon-Viet Nguyen
(74) *Attorney, Agent, or Firm* — Suiter Swantz pc llo

(57) ABSTRACT

The invention may be embodied in radio frequency power amplifier (RF-PA) predriver circuits employing a hybrid analog/digital RF architecture including a resynchronizing digital-to-analog convertor to drive an efficient high-power output stage suitable for driving standard high power amplifier (HPA) output devices. The hybrid analog/digital RF architecture retains the advantages of high digital content integration found in conventional Class-S architecture, while relaxing the performance requirements on the output transistors and on the bitstream generator. The resulting predriver circuit combines the VLSI integration benefits of digital designs with the extensibility to arbitrary output power levels characteristic of analog designs. The hybrid analog/digital driving circuit is well suited for use with analog and Class-S HPAs used in wireless communication systems, such as the Doherty type HPA.

20 Claims, 7 Drawing Sheets

HYBRID DIGITAL/ANALOG POWER AMPLIFIER

TECHNICAL FIELD

The present invention relates to high power radio frequency power amplifiers (RF-PAs) suitable for use in wireless communications and, more particularly, to a predriver subassembly employing a hybrid digital/analog RF architecture including a resynchronizing digital-to-analog convertor to drive an efficient high-power output stage.

BACKGROUND

Several types of radio frequency power amplifier (RF-PA) transmit chains are known in the art. Analog-based chains generally perform baseband and intermediate-frequency signal processing through digital signal processing (DSP), then transition through precision high speed high-resolution digital-to-analog convertors (DACs) to the analog domain at an intermediate-frequency (IF). Filtering at IF, quadrature upconversion to the desired carrier frequency, and power amplification complete the chain. This type of analog amplifier chain enjoys the advantage of extensibility to arbitrary output power levels, especially in the final high-power stage, making this type of predriver suitable for driving high powered amplifiers (HPAs) used in wireless base stations, such as Doherty HPAs. However, the requirement for multiple low jitter, low phase noise synthesizers and functional blocks complicates the design and requires nulling of in-phase and quadrature (I and Q) mismatches.

Class-S digital amplifiers employ techniques akin to those used in switch mode Class-D audio amplifiers. Class-S amplifiers have the advantage of migrating a major part of the predriver functionality to the digital domain, where very large scale integration (VLSI) technology reduces chip count and eliminates offsets and drifts characteristic of analog circuitry. However, the high switching frequencies involved, typically four times the carrier frequency, combined with output device non-idealities, erode efficiency and introduce spectral distortion. These effects increase as power outputs rise, due to larger required devices and higher parasitic power losses.

There is, therefore, a continuing need for improved predriver circuits suitable for driving high power RF-PAs used for wireless communications. More particularly, there is a need for RF-PA predriver circuit architectures that combine the VLSI integration benefits of Class-S digital designs with the extensibility to arbitrary output power levels characteristic of analog designs.

SUMMARY

The invention may be embodied in RF-PA predriver circuits employing a hybrid analog/digital RF architecture including a resynchronizing digital-to-analog convertor to drive an efficient high-power output stage used for wireless communications. The hybrid analog/digital RF architecture retains the advantages of high digital content integration found in conventional Class-S architecture, while relaxing the performance requirements on the output transistors and on the bitstream generator. The resulting predriver circuit combines the VLSI integration benefits of Class-S digital designs with the extensibility to arbitrary output power levels characteristic of analog designs. The hybrid analog/digital driving circuit is therefore well suited for use with standard analog high power amplifiers used in wireless communication systems.

Packaging of the completed RF-PA subassembly is eased, as conventional bandpass RF matching techniques can be employed everywhere except within the RF-DAC integrated circuit, where signals are digital. Band pass filtering is performed at a low power level, thus attenuating outband bitstream noise and relaxing intermodulation requirements on the post-DAC gain stages. Further, the requirement for full scale stability of the bitstream generator is relaxed, as low bitstream modulation depths can be compensated for with increased gain in the DAC and its subsequent gain stages. In addition, the hybrid analog/digital RF architecture is capable of extending digital RF techniques to arbitrarily high emitted power levels and arbitrarily high carrier frequencies, at which conventional Class-S super-harmonic output device switching at multiples of the carrier frequency is not feasible. Efficiency is dependent largely upon the structure selected for the high-power output stage due to migration of the bulk of the signal processing to the digital domain.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE FIGURES

The numerous advantages of the invention may be better understood with reference to the accompanying figures in which.

DETAILED DESCRIPTION OF ILLUSTRATIVE EMBODIMENTS

Figure 1:
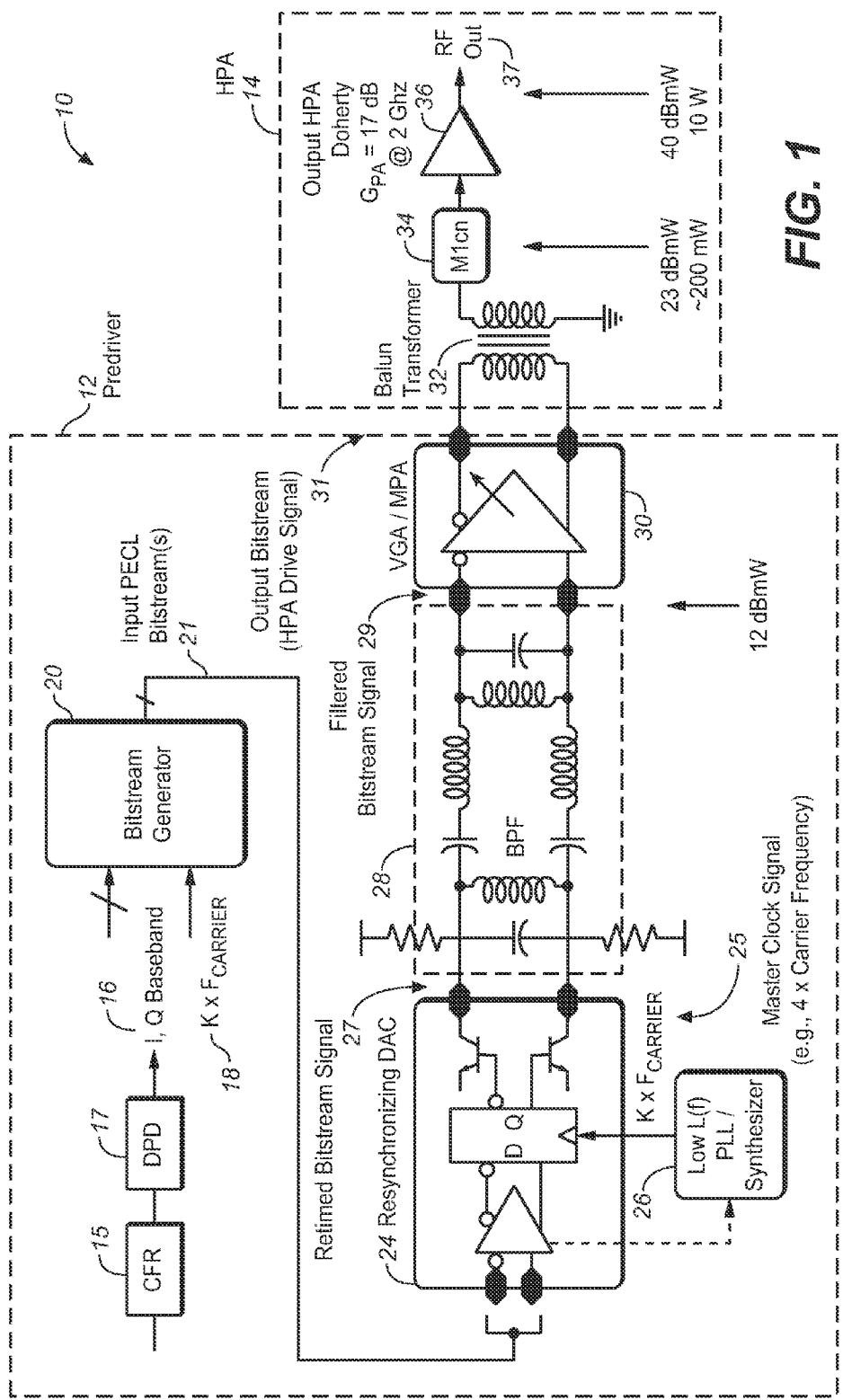
FIG. 1 is a schematic diagram of a hybrid analog/digital RF predriver driving a high power amplifier.

A popular radio frequency power amplifier (RF-PA) transmit chain utilizes direct conversion in which intermediate frequency (IF) in-phase and quadrature signals (I and Q) are digitally synthesized by combining multiple baseband I and Q channels and up-translating the result to IF. Independent high-resolution digital-to analog convertors (DACs) convert the I and Q to analog form, which is band pass filtered (BPF), a process which may be aided by upsampling and prefiltering in the DAC units. The result is quadrature-upconverted by mixing up to the carrier frequency and applied to drive the RF-PA. This approach requires two spectrally-pure synthesizers in addition to a significant number of precision analog components. Inter-channel I and Q mismatch necessitates continual recalibration. In addition, digital predistortion (DPD) and crest-factor reduction (CFR) processing are customarily applied in the digital domain to compensate for RF-PA nonlinearities, reduce the required RF-PA dynamic range, and improve efficiency of the system.

The Class-S digital RF-PA is an alternative circuit approach that employs a spectrally shaped bitstream to switch the output stages in binary fashion. In operation, a bitstream generator, such as a sigma-delta modulator or Viterbi-based optimal-bit-pattern modulator, encodes an input baseband digital data signal into a digital pulse stream in which the information-bearing baseband signal is frequency-translated to a desired carrier frequency. Simultaneously, the encoding process shapes quantization noise, assuring that it is greatly attenuated in the vicinity of the carrier frequency and shifted out of the transmission band. The resulting bitstream drives the gates of a push-pull switch-mode final stage through a level shift gate driver. The output of the final stage passes through a band pass filter (BPF) to recover the modulated RF signal and to eliminate the out-band quantization noise.

The conventional Class-S RF-PA, although theoretically capable of efficiencies approaching 100%, has several shortcomings. The output transistors are operated in pulse mode at a superharmonic of the carrier frequency, which requires rapid transition between ON and OFF states to minimize distortion and efficiency loss. Transistor switch time is more stringent than required for conventional linear or Class E/F schemes that operate at the carrier frequency; high power necessitates large device area, thus increasing stray capacitance and degrading rise times. For example, in a 2 GHz-band system, the fundamental output period of a band pass bitstream may be 1/(4×2 GHz)=125 ps; and drain current transition times of <<125 ps are required. Reduction of oversample rate from 4× to 2× an approximately 3 dB (sin x)/x rolloff penalty and consequent power loss. A high-power BPF is required to exclude out-of-band noise, and introduces losses. Transmit-receive feed through considerations mandate that the BPF be proximate to the power switching stages.

In addition, because the Class-S RF-PA is operated in the pulse regime, all signal paths preceding the BPF must be wideband, precluding narrowband RF matching techniques, and requiring physically compact of MMIC hybrid packaging. For high RF-PA efficiency, the bitstream generator must present acceptable signal-to-noise distortion ratio (SNDR) over nearly its full range (i.e., the output all-off to output all-on range). The stability boundary of most single-bit sigma-delta modulators can exceed 50% using advanced techniques, but achieving that result while preserving adequate SNDR remains hard to achieve.

The present invention overcomes these shortcomings in prior RF-PA drive circuits through utilization of an RF-PA predriver circuit employing a hybrid analog/digital RF architecture including a resynchronizing digital-to-analog convertor suitable for driving standard HPA output devices. The hybrid analog/digital RF architecture retains the advantages of high digital content integration found in conventional Class-S architecture, while relaxing the performance requirements on the output transistors and on the bitstream generator. The resulting predriver circuit combines the VLSI integration benefits of Class-S digital designs with the extensibility to arbitrary output power levels characteristic of analog designs.

The hybrid analog/digital driving circuit is well suited for use with analog high power amplifiers used in wireless communication systems.

FIG. 1 is a schematic diagram of a RF-PA system 10 including a hybrid analog/digital RF predriver 12 driving a HPA 14. A bitstream generator 20 operates at a fundamental clock rate to encode an information-bearing baseband I and Q digital data signal 16 onto a desired carrier frequency 18 to produce bitstream 21. The bitstream generator clock rate is typically a harmonic of the desired carrier frequency (K×Fcarrier), such as four times the desired carrier frequency 18. The bitstream generator 20 typically receives the digital data signal 16 in the form of aggregated in-phase and quadrature (I and Q) baseband signals 16 produced by frequency shifting independent baseband I and Q channels into juxtaposition. A crest factor reduction (CFR) processor 15 and a digital predistortion (DPD) processor 17 may be applied to the digital data signal 16 before delivery of the aggregated I and Q baseband signals 16 to the bitstream generator 20. The role of the CFR and DPD processors is chiefly to reduce the dynamic range required for the predriver 12 and to correct nonlinearities and reduce spectral regrowth in the output HPA 14. It should be noted that the CFR processor 15 and/or the DPD processor 17 may be embedded within the decision mechanism of the bitstream generator 20.

The input bitstream 21 is conveyed to a resynchronizing digital-to-analog converter (DAC) 24, preferably in low voltage differential positive emitter-follower logic (PECL) format. Although a single-bit serial path is shown for this particular example, it is possible to employ parallel transfer with aid of deserialization in the bitstream generator 20 and serialization in the resynchronizing DAC 24. Due to logic complexity, the bitstream generator 20 is preferably realized in high-density digital CMOS, using an internal clock generator. As such oscillators are commonly ring type or employ low-Q reactive elements, their phase noise performance will be inadequate to serve the air interface. For this reason, and to eliminate transmission asymmetries arising in the bitstream path into the DAC 24, a retiming flip-flop is provided as part of the DAC to resynchronize the incoming bitstream 21 using a master clock signal 25 generated by a low jitter, low phase noise master clock oscillator 26 operating at the stream sample rate, which is typically four times the desired carrier frequency.

As the DAC 24 contributes only fractionally to overall efficiency, any inability to attain full bitstream modulation depth can be compensated for with increased gain in the following low-level stages. The DAC 24 is preferably fabricated in a high speed SiGe BiCMOS process, which only minimally corrupts the signal in passage. Since DPD must correct frequencies up to third/fifth harmonics of transmitted signal, the path bandwidth from the DAC 24 to the output HPA 14 should be three- to five-fold that of the information bandwidth.

The retimed bitstream signal 27 output from the resynchronizing DAC 24 is band pass filtered by the BPF 28. Although the BPF in this particular example is shown a discrete network, it may also be realized as a transmission line, electroacoustic-wave filter, or any other suitable BPF technology. In turn, the filtered bitstream signal 29 output from the BPF 28 is applied to a medium power variable gain amplifier (MPA VGA) 30 for power level elevation to above the 20 dBmW range required to drive the final output High Power Amplifier 14 to the desired power levels of typically 40 dBmW. The BPF 28 is placed as early as possible in the signal chain, to prevent bitstream outband noise from creating intermodulation distortion in the subsequent amplifier stages.

The output HPA 14 may be a Doherty type typically operating at 2 GHz yielding 45% to 60% efficiencies under approximately 6.5 dB PAPR of CFR-reduced multicarrier signals and having approximately 17 dB power gain. Multipath Doherty designs may also be selected to improve efficiency under power backoff. Additional MPA stages and increased HPA power may be employed to elevate the output power to arbitrary levels. The HPA 14 may be constructed using common LDMOS or GaN devices; no special device requirements are imposed. It should be noted that although the MPA 30 is depicted in FIG. 1 as a differential type, in which a balun transformer 32 and a matching network 34 are required at the input of the HPA 14 network, other suitable types of MPAs may be utilized with corresponding modifications to the output HPA.

Figure 2:
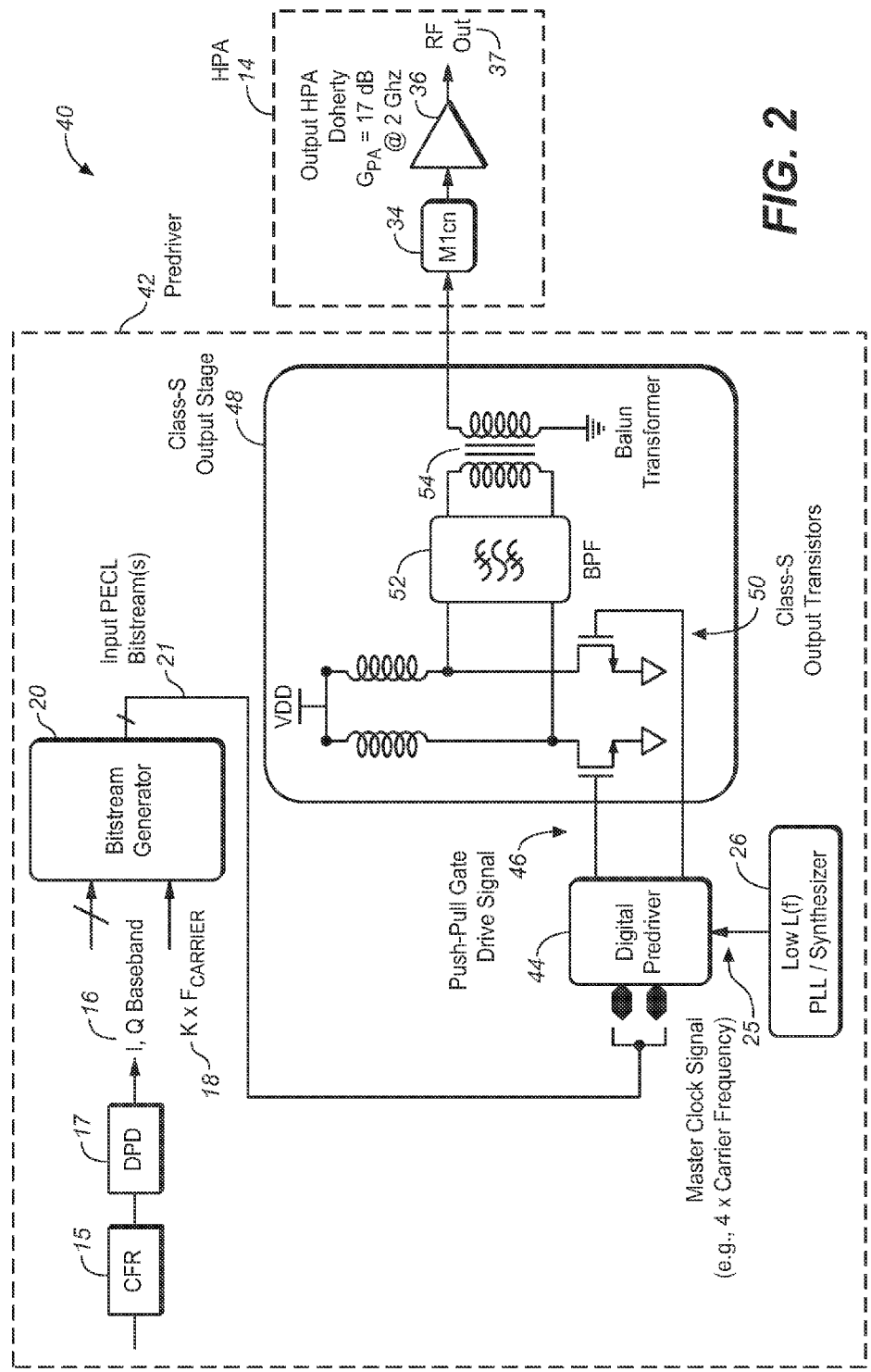
FIG. 2 is a schematic diagram of an alternative embodiment of the hybrid analog/digital RF amplifier system.

FIG. 2 is a schematic diagram of an RF-PA system 40 that includes a Class-S hybrid analog/digital RF predriver 42 driving an HPA 14, which again may be a Doherty type 17 dB operating at 2 GHz. The predriver 42 includes a bitstream generator 20 with pre-generator CFR 15 and DPD 17 processors producing an input bitstream 21 along with a master clock oscillator 26 equivalent to those described with reference to the RF-PA system 10 shown in FIG. 1. In this alternate design, however, the input bitstream is provided to a digital predriver 44 to produce a nominally complementary output pulse signal 46 configured to drive the gates of the output transistors 50 of the Class-S predriver 48, which in turn drives the HPA 14.

This alternate implementation of the HPA driver is well suited for producing output power levels in the 1 to 25 Watt range commonly utilized in wireless communication base stations. In this embodiment, a low-power direct Class-S predriver output stage 48 with an internal BPF 52 drives the HPA 14. A balun transformer 54 which may be implemented as part of the output stage 48, along with an input matching network 34 which may be implemented as part of the HPA input stage may be located between the BFP 52 and the amplifier 36 of the HPA 14. Note that although the output stage 48 is depicted here as a current-mode type, the dual voltage-mode configuration is also applicable.

Use of the push-pull digital predriver 44 as the gate driver for the Class-S predriver output stage 48 to an extent sidesteps the deficiencies of the Class-S approach in that the output signal of the predriver 48 is at a comparatively low power level, on the order of 33 dBmW for an RF system output signal 37 having power of 50 dBmW (100W) and 17 dB HPA gain. Small, fast-switching Class-S devices can therefore be used in the predriver 48; which renders the Class-S switching efficiency a non-dominant factor in the overall system efficiency calculations.

Figure 3:
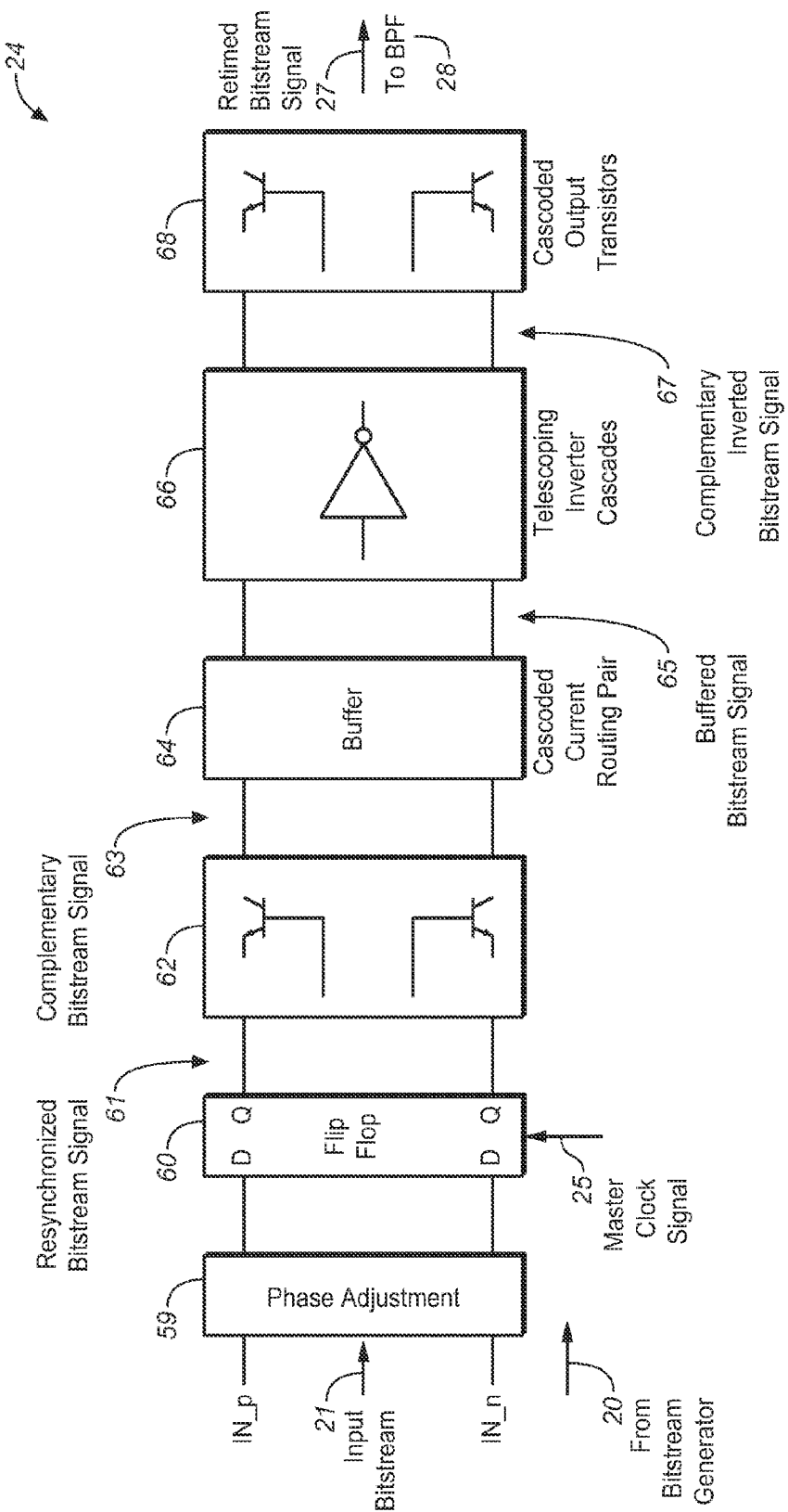
FIG. 3 is a block diagram of the resynchronizing DAC of the first embodiment of the hybrid analog/digital RF amplifier system.
Figure 4:
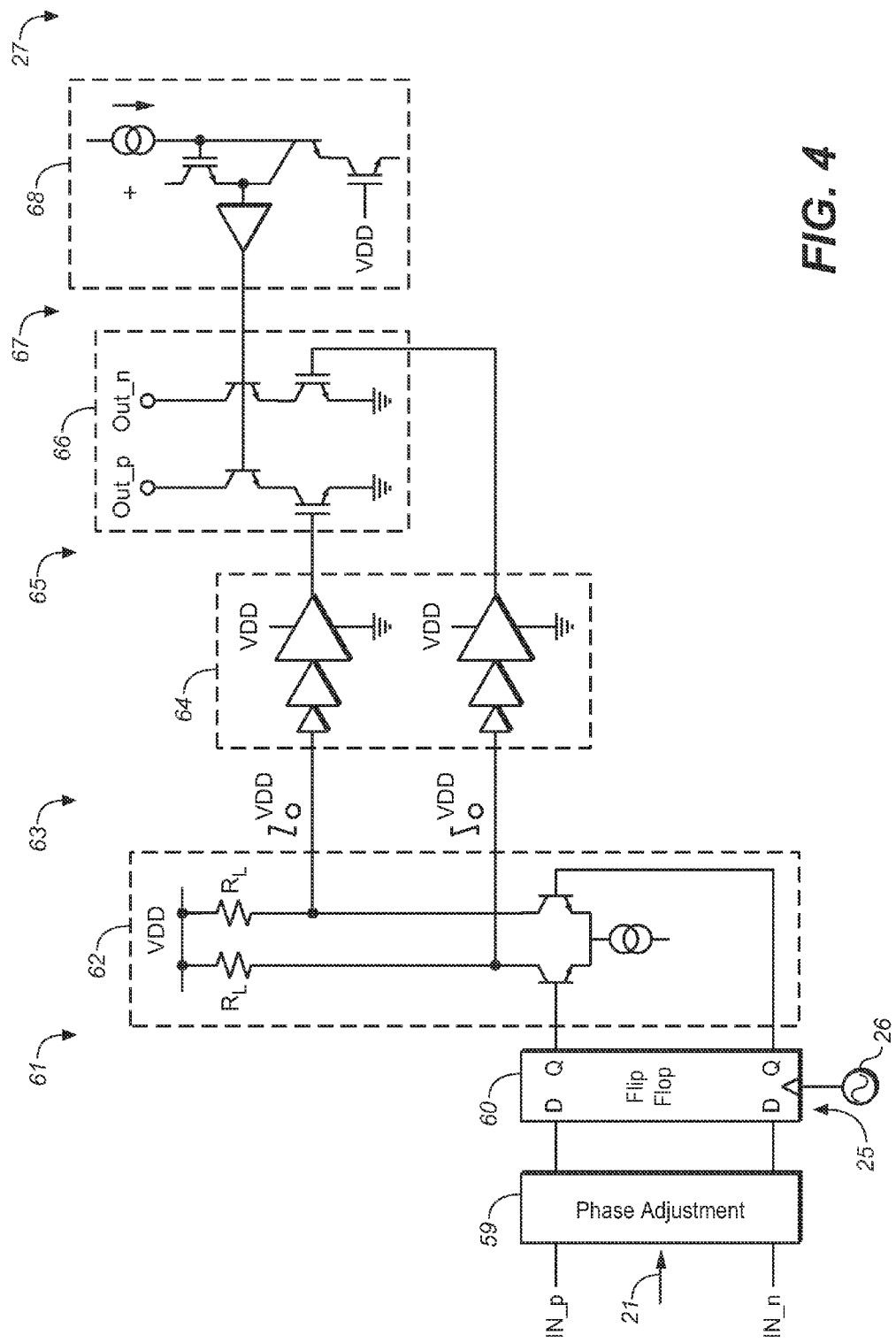
FIG. 4 is a schematic diagram of the resynchronizing DAC of the first embodiment of the hybrid analog/digital RF amplifier system.

FIG. 3 is a block diagram and FIG. 4 is a schematic diagram of the resynchronizing DAC 24 in the hybrid analog/digital RF preamplifier 42 shown in FIG. 1. The DAC 24 includes a novel high-power output stage 68 that is compatible with the specific RF HPA 14 shown in FIG. 1. Other configurations are within the spirit of the invention. In this particular embodiment, the input bitstream 21 from the bitstream generator 20 is received at IN_p/IN_n terminals of the resynchronizing flip-flop 60, where it is resynchronized to the desired carrier frequency 18 using the master clock signal 25, in this example four times the desired carrier frequency, provided by the master clock oscillator 26 to produce a resynchronized bitstream signal 61. The resynchronized bitstream signal 61 is applied to a cascoded current-routing pair 62. The resistively-loaded collectors of the pair 62 generate a complementary bitstream signal 61 that is buffered and down-shifted by an emitter follower buffer 64 to produce a buffered bitstream signal 65 before being applied to telescoping inverter cascades 66, which produce complimentary inverted bitstream signals 67 to drive the gates of N-channel CMOS devices in the emitters of cascoded output bipolar npn transistors 68. The cascoded output transistors 68, in turn, produce the retimed bitstream signal 27 that is passed through the BPF 28 and applied to the VGA/MPA 30 to produce the output bitstream signal 31 that drives the HPA 14.

The bases of the cascoded output transistors 68 are regulated to a stiff voltage of level that is sufficient, when the associated CMOS device 68 is turned on, to cause collector current flow of a specified value, for example 150 mA. By virtue of this approach, in which the emitters of the transistors are alternatively open circuited and connected to fixed resistance, the output npn transistors 68 of the DAC 24 are operated in the BVcbo, rather than BVceo regime, yielding high breakdown performance. In a common-emitter configuration near breakdown, the transistor current gain $\beta$ magnifies the base current arising from b-c junction impact-ionization holes pulled into the base layer. As a result, BVcbo is equal to BVceo times $\beta^{1/m}$ where m is an empirical factor of approximately four in silicon. For a SiGe BiCMOS process, for example, having $\beta$ approximately 50 and BVceo approximately 3.5V, BVcbo is approximately 8V. Collector voltage peak-peak swings of approximately 8V across a 50 Q load are thus available, yielding RF-DAC output power of at least 22 dBmW at each terminal.

For retiming of the digital data signal, the resynchronizing DAC 24 includes a low-jitter master clock oscillator 26 generating a master clock signal 25 operating at a harmonic of the desired carrier frequency 18, such as four times the desired carrier frequency, for resynchronizing the input digital data signal 21 at the desired carrier frequency 18. Resynchronization of the digital data bitstream 21 with the desired master clock signal 25 eliminates asymmetries arising from signal transmission over backplane conductors from the bitstream generator 20, which due to high logic complexity, is preferably realized on a silicon chip using in fine-line CMOS technology. Further, resynchronization allows use in bitstream generator of a clocking PLL having poorer phase noise characteristics than required for the emitted RF signal.

The bitstream digital data signal 21 delivered to the resynchronizing DAC 24 from the sigma-delta modulator or other means represented by the bitstream generator 20 shown in FIG. 1 may be delivered in differential (preferred) format, or any other suitable format that the DAC 24 is configured to receive. Within the DAC 24, the digital data signal 21 is resynchronized upon receipt by the low phase noise (low-jitter) master clock oscillator 26 through the retiming flip-flop 60. The retiming flip-flop 60 is preferably preceded by a phase adjustment block 59 which centers the eye of the incoming bitstream 21 upon the retiming clock signal 25 delivered by low phase noise oscillator 26. Phase adjustment accounts for time skew between the bitstream generator clock and the low phase noise master clock 26. These clocks are of exactly the same frequency, but may have arbitrary phase offset due to tolerances in interconnect length; transceiver delays, and phase shift in the on-chip PLL which clocks bitstream generator 20.

Figure 5A:
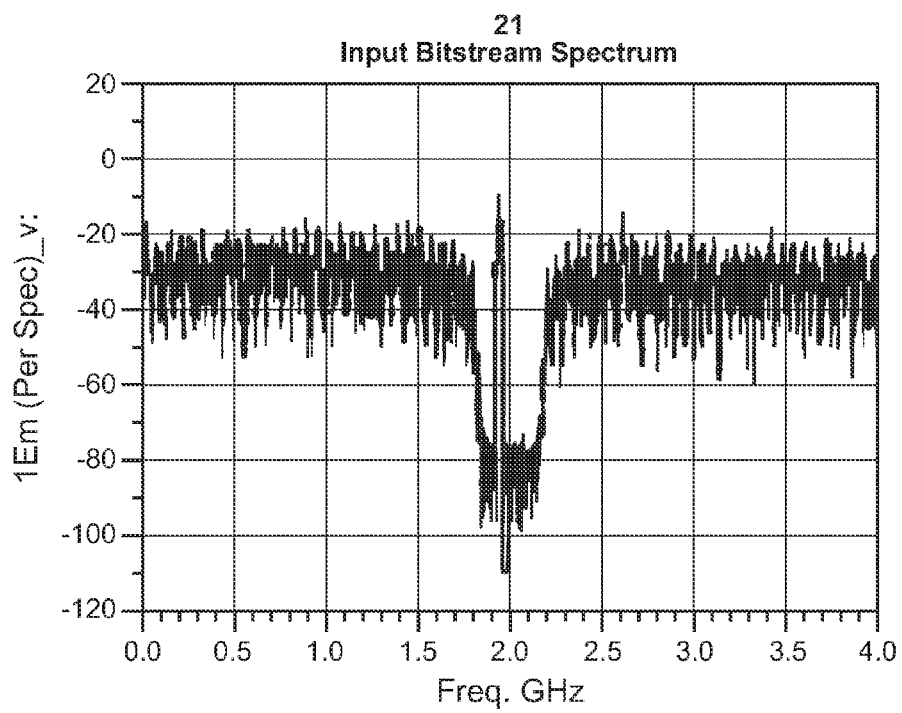
FIG. 5A is a graph illustrating the frequency spectrum of the input bitstream in the hybrid analog/digital RF predriver.
Figure 5B:
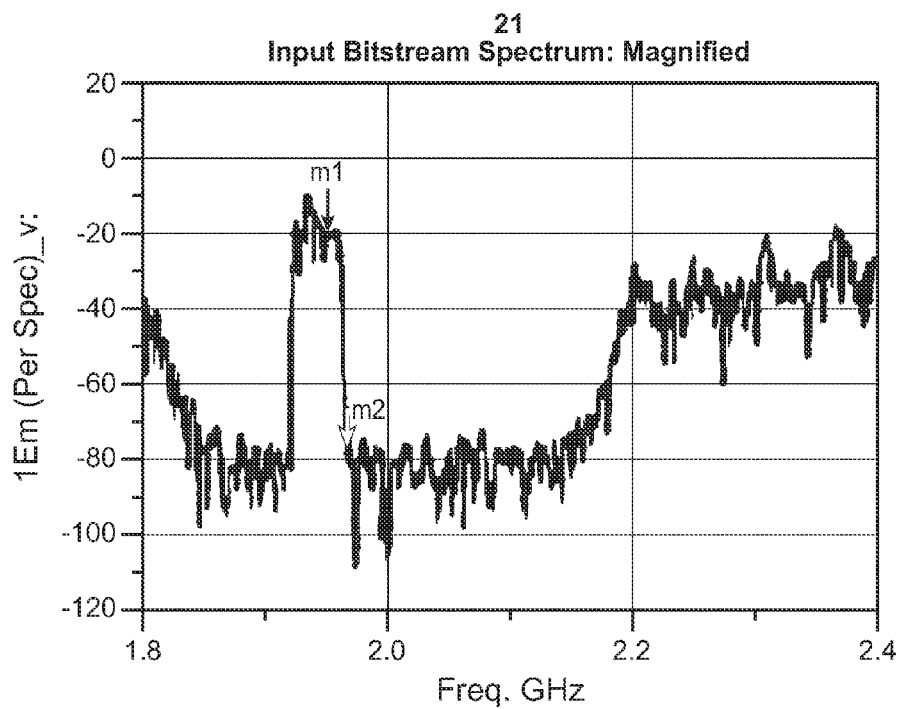
FIG. 5B is a graph illustrating a magnified portion of the frequency spectrum of the input bitstream in the hybrid analog/digital RF predriver.
Figure 6A:
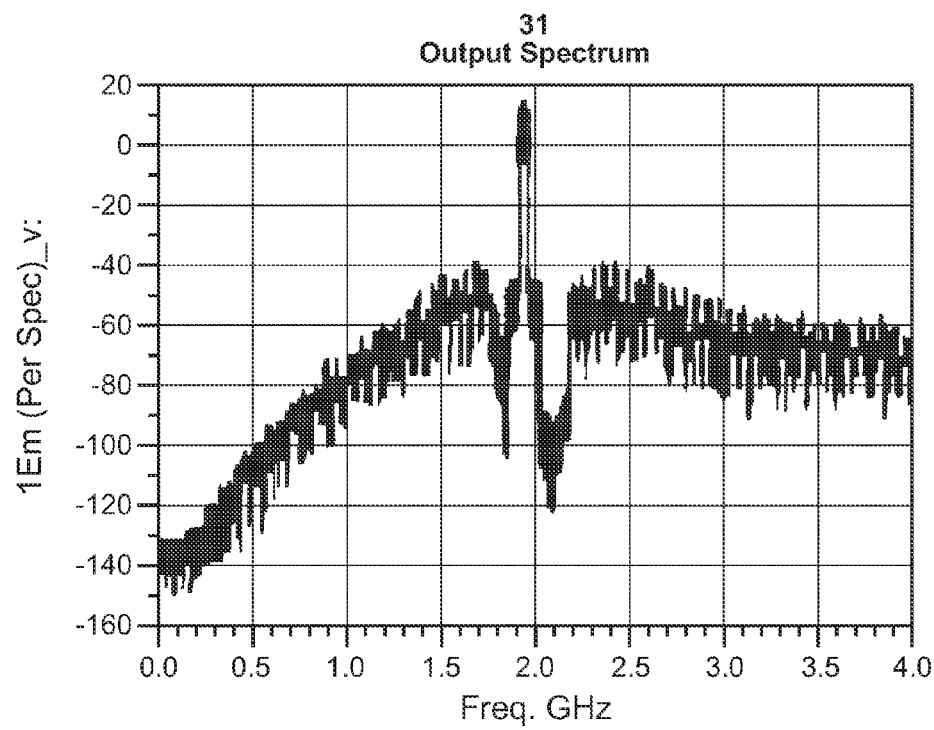
FIG. 6A is a graph illustrating the frequency spectrum of the output bitstream in the hybrid analog/digital RF predriver.
Figure 6B:
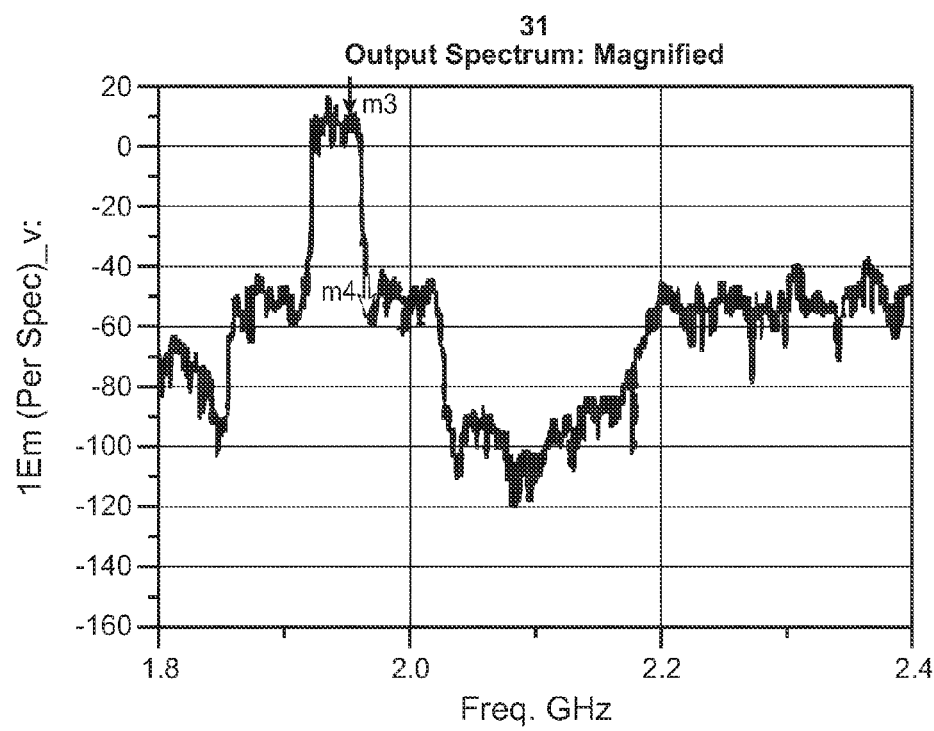
FIG. 6B is a graph illustrating a magnified portion of the frequency spectrum of the output bitstream in the hybrid analog/digital RF predriver.
Figure 7:
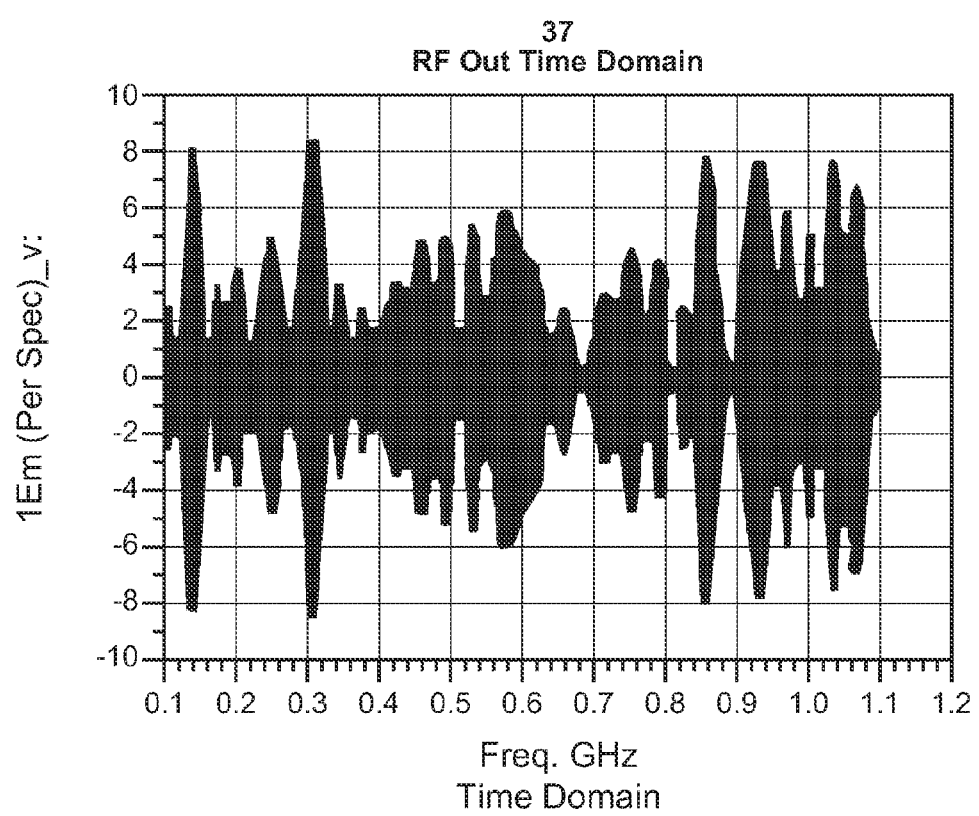
FIG. 7 is graph illustrating the output RF signal in the time domain for a HPA driven by the hybrid analog/digital RF predriver.

FIG. 5A is a graph illustrating the frequency spectrum of the input bitstream 21 in the hybrid analog/digital RF predriver system 10 shown in FIG. 1 in the frequency range from zero to 4.0 GHz. FIG. 5B is a graph illustrating a magnified portion of the frequency spectrum the input bitstream 21 in the frequency range from 1.0 to 2.4 GHz. FIG. 6A is a graph illustrating the frequency spectrum of the output bitstream 31 in frequency range from zero to 4.0 GHz, and FIG. 6B shows a magnified portion of the frequency spectrum the output bitstream 31 in the frequency range from 1.0 to 2.4 GHz. FIG. 7 is graph illustrating the RF output signal 37 of the HPA 14 in the time domain for an illustrative Doherty type 17 dB HPA 14 operating at 2.0 GHz. It will be appreciated that the gain of the predriver 12 is at least 22 dBmW as required to drive the HPA 14 and that the invention is not limited to driving this particular Doherty type HPA selected to illustrate the operating principles of the invention.

The present invention may consist (but not required to consist) of adapting or reconfiguring presently existing systems. Alternatively, original equipment may be provided embodying the invention.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

The invention claimed is:

1. A radio frequency predriver [12] for driving a high power radio frequency amplifier [14] in a transmission direction, comprising:

a bitstream generator [20] operative for receiving a baseband digital data signal [16] and a desired carrier frequency [18] and generating an input bitstream [21] at the desired carrier frequency encoding the digital data signal [16];

an oscillator [26] operative for creating a master clock signal [25];

a resynchronizing digital-to-analog converter [24] operative for generating a resynchronized bitstream signal [27] encoding the digital data signal [16] based on the input bitstream [21] and the master clock signal [25];

a band pass filter [28] operative for generating a filtered bitstream signal [29] based on the resynchronized bitstream signal [27]; and a power amplifier [30] operative for generating an output bitstream [31] based on the filtered bitstream signal [29] configured to drive the high power radio frequency amplifier [14], wherein:

the resynchronizing digital-to-analog converter [24] is a multiple-bit parallel digital-to-analog converter;

the bitstream generator [20] is further operative for performing deserialization of the input bitstream [21]; and the resynchronizing digital-to-analog converter [24] is further operative for performing serialization of the resynchronized bitstream signal [27].

2. The radio frequency predriver of claim 1, further comprising a crest factor reduction processor [15] operative for processing the digital data signal prior to receipt by the bitstream generator [20].

3. The radio frequency predriver of claim 2, further comprising a digital predistortion processor [17] operative for processing the digital data signal prior to receipt by the bitstream generator [20].

4. The radio frequency predriver of claim 3, wherein the crest factor reduction processor and the digital predistortion processor are operative to reduce the dynamic range required for the predriver [12] and to correct nonlinearities and reduce spectral regrowth in the HPA [14].

5. The radio frequency predriver of claim 1, wherein the resynchronizing digital-to-analog converter [24] is a single-bit serial digital-to-analog converter.

6. The radio frequency predriver of claim 1, wherein the input bitstream [21] is in positive emitter-coupled logic format.

7. The radio frequency predriver of claim 1, wherein the resynchronized bitstream signal [27] is in low voltage differential signal positive emitter-follower logic format.

8. The radio frequency predriver of claim 1, wherein the medium power amplifier [30] raises the power level of the filtered bitstream signal [29] to at least 20 dBmW.

9. The radio frequency predriver of claim 1, wherein the band pass filter [28] is located prior to the power amplifier [30] in the transmission direction to prevent bitstream outband noise from creating intermodulation distortion in the subsequent amplifier stages in the transmission direction.

10. A radio frequency predriver [42] for driving a high power radio frequency amplifier [14], comprising:

a bitstream generator [20] operative for receiving a baseband digital data signal [16] and a desired carrier frequency [18] and generating an input bitstream [21] at the desired carrier frequency encoding the digital data signal [16];

an oscillator [26] operative for creating a master clock signal [25]; and a digital predriver [44] operative for generating a push-pull gate drive signal [46] based on the input bitstream [21] and the master clock signal [25], wherein the digital predriver [44] further comprises a resynchronizing flip-flop [60] operative to generate a resynchronized bitstream signal [61] encoding the digital data signal [16] based on the input bitstream [20] and the master clock signal [25].

11. The radio frequency predriver of claim 10, further comprising a Class-S predriver output stage [48] operative to amplify the push-pull gate drive signal [46] to drive the high power radio frequency amplifier [14].

12. The radio frequency predriver of claim 11, wherein the Class-S predriver output stage [48] further comprises a balun transformer.

13. The radio frequency predriver of claim 10, wherein the high power radio frequency amplifier [14] further comprises a matching network to achieve desired power transfer from the radio frequency predriver circuit [42].

14. The radio frequency predriver of claim 10, wherein the Class-S predriver output stage [48] further comprises a band pass filter.

15. The radio frequency predriver of claim 10, wherein the resynchronizing digital predriver [44] further comprises an emitter follower buffer [62] operative to buffer and downshift the resynchronized bitstream signal [61] to produce a buffered bitstream signal [63].

16. The radio frequency predriver of claim 15, wherein the resynchronizing digital predriver [44] further comprises a cascoded current routing pair of transistors [64] operative to produce complimentary bitstream signals [65] based on the buffered bitstream signal [63].

17. The radio frequency predriver of claim 16, wherein the resynchronizing digital predriver [44] further comprises a telescoping inverter cascade [66] operative to produce a pair of complimentary inverted bitstream signals [67] based on the pair of complimentary bitstream signals [65].

18. The radio frequency predriver of claim 17, wherein the resynchronizing digital predriver [44] further comprises a pair of cascoded output transistors [68] operative to produce the push-pull gate drive signal [46] based on the pair of complimentary inverted bitstream signals [67].

19. A radio frequency power amplifier system comprising:

a Class-S high power radio frequency amplifier [14];

a predriver [42] for driving the high power radio frequency amplifier [14], comprising:

a bitstream generator [20] operative for receiving a baseband digital data signal [16] and a desired carrier frequency [18] and generating an input bitstream [21] at the desired carrier frequency encoding the digital data signal [16], an oscillator [26] operative for creating a master clock signal [25], and a digital predriver [44] operative for generating a push-pull gate drive signal [46] based on the input bitstream [21] and the master clock signal [25]; and a Class-S predriver output stage [48] operative to amplify the push-pull gate drive signal [46] to drive the Class-S high power radio frequency amplifier [14], wherein the digital predriver [44] further comprises a resynchronizing flip-flop [60] operative to generate a resynchronized bitstream signal [61] encoding the digital data signal [16] based on the input bitstream [20] and the master clock signal [25].

20. The radio frequency power amplifier system of claim 19, further comprising:

a balun transformer [32] at the output of the Class-S predriver output stage [48]; and a matching network [34] at the input of the high power amplifier [14].

* * * * *